United States Patent [19]
Spear

[11] Patent Number: 6,075,800
[45] Date of Patent: Jun. 13, 2000

[54] BONDING RIDGE STRUCTURE LASER DIODES TO SUBSTRATES

[75] Inventor: David Alan Hugh Spear, Torquay, United Kingdom

[73] Assignee: Nortel Networks Corporation, Montreal, Canada

[21] Appl. No.: 09/072,810

[22] Filed: May 5, 1998

[51] Int. Cl.[7] ............................... H01S 3/04; H01S 3/19; H01L 23/48

[52] U.S. Cl. ............................... 372/36; 372/34; 372/50; 438/25; 438/26; 438/108; 438/118; 257/777; 257/778

[58] Field of Search .................................. 372/36, 34, 50; 438/25, 26, 108, 118; 257/777, 778

[56] References Cited

PUBLICATIONS

Nakada et al, 1974, applied physics, vol. 13 No. 9, pp. 1435–1436.

*Primary Examiner*—Frank G. Font
*Assistant Examiner*—Armando Rodriguez
*Attorney, Agent, or Firm*—Lee, Mann, Smith, McWilliams, Sweeney & Ohlson

[57] ABSTRACT

A way of bonding a ridge-structure laser diode chip ridge face down on to a substrate with solder is disclosed in which the substrate surface includes a region facing the ridge of the laser that is not wetted by solder, this region being flanked by regions that are wetted and by which the solder bonds the chip to the substrate in a manner that leaves the ridge freely spaced from the substrate surface.

4 Claims, 3 Drawing Sheets

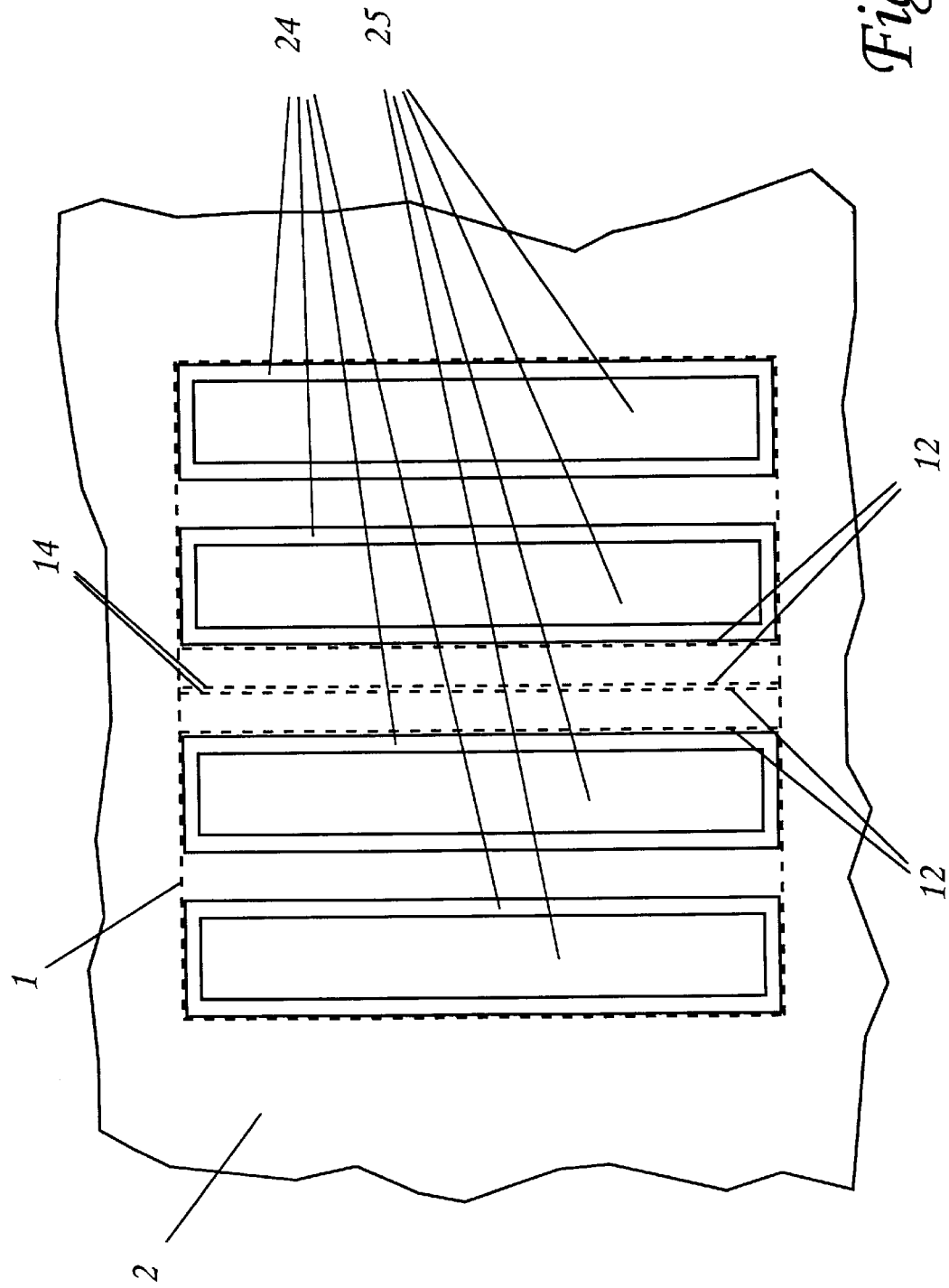

BONDING RIDGE STRUCTURE LASER DIODES TO SUBSTRATES

BACKGROUND OF THE INVENTION

One of the electrical connections made to a laser diode chip is typically a wire bond connection, while the other electrical connection is typically provided by way of the substrate to which that chip is bonded. That bond with the substrate is typically a solder bond, and for this purpose a hard solder, typically a substantially eutectic gold-tin solder, is generally employed because it provides a bond significantly less susceptible to creep than an equivalent bond effected using soft solder. The substrate to which the chip is bonded also performs the function of a heat-sink, or of a low thermal impedance pathway to a heat-sink. A laser diode chip typically comprises a number of epitaxial layers grown upon a single crystal slice in which the aggregate thickness of the epitaxial layers is much less than the thickness of the single crystal slice, even after that slice has been thinned. Since the heat that is generated by operation of the laser is heat generated within the epitaxial layers, it is generally preferred to bond laser diode chips epitaxial layers face-down on to their heat-sink substrates. A feature of laser diode chip manufacture is that the thickness of the epitaxial layers are typically held within closer tolerances than that of the thickness of the thinned slices upon which those layers are grown. Accordingly, bonding laser chips epitaxial layers face down is liable to facilitate the achieving of a close tolerance in the height of the laser emission above the surface of the substrate than when the chips are bonded expitaxial layers face-up. This can be of particular benefit when the surface of the substrate is also used as a reference surface with which one or more other optical elements are aligned for optical coupling with the laser emission. For instance it facilitates efficient coupling of the laser emission with an optical fibre that is aligned by being secured in a V-groove crystallographically etched in a single crystal silicon substrate, such as that described in U.S. Pat. No. 5,522,000.

One of the structures of laser diode chip that it is desired to bond to substrates is the ridge-structure laser. In such a laser a pair of parallel troughs are formed in the epitaxially deposited layers, defining between these troughs an intervening ridge is which lasing occurs. The ridge performs a lateral optical waveguide function and, by restricting the area over which electrical contact is made with the topmost epitaxial layer, exercises a degree of lateral confinement upon the injection of minority carriers into the active layer of the laser.

In a ridge structure laser, as in other types of laser diode, minority carriers injected into the active layer provide optical gain within the semiconductor material, and some form of optical positive feedback mechanism is then required to produce laser action. Such positive feedback can be provided by Fresnel reflection at the end facets of the laser chip, resulting in what is termed Fabry Perot feedback, such lasers often being referred to as FP lasers. Reflection can alternatively be provided by a Bragg grating structure. Thus end-facet Fresnel reflection at either or both ends of the chip can be suppressed, and its place taken by a Bragg grating structure near that end, thereby producing a type of laser structure known as a Distributed Bragg Reflection laser or DBR laser. Alternatively a Bragg grating structure can be formed that extends most of the length from one Fresnel reflection suppressed end facet to the other thereby producing a type of laser structure known as a Distributed Feed-Back laser or DFB laser.

When solder bonding a laser diode chip to a substrate, it might be thought best to have the solder bond extend across the full extent of the chip face because this should minimise the thermal impedance presented by the solder. In practice it has been found preferable, at least in certain circumstances, to bond ridge-structure FP laser diode chips expitaxial layers face-down on substrates using parallel stripes of solder, each extending substantially the full length of a chip, but having a width that is small compared with the full width of the chip. In respect of an individual laser diode chip, one of these stripes is arranged to register with the ridge, this stripe being flanked by at least two others that are provided to register with the face of the chip on either side of the ridge-and-troughs structure. Such an arrangement is for instance employed in the 1500 nm Mini-DIL TRANSMITTER marketed by Nortel Limited. The use of these stripes is found to lead to a more consistent height in the bonded laser of the expitaxial layers above the substrate. In these marketed devices only the central solder stripe that registers with the chip ridge makes electrical connection with an electrical interconnection connection layer of the substrate. The other solder stripes are electrically isolated from that interconnection layer, and so perform no electrical function; their function is that of providing mechanical stability and additional thermal conduction paths between the chip and the substrate.

Adopting the same procedure in respect of mounting ridge-structure DFB laser diode chips on substrates has been found to give rise to unacceptable degradation of laser performance. One solution to this problem is to bond such chips the other way up, i.e. solder them to their substrates epitaxial layers face-up. However, for many applications this is far from an ideal solution because of the increased thermal impedance thereby presented between the active region in the chip and the substrate to which that chip is bonded, and additionally because the height of the active layer above the substrate surface is liable to vary more from chip to chip because of differences in thickness, after thinning, of the semiconductor slices upon which the expitaxial layers of those chips have been deposited.

SUMMARY OF THE INVENTION

A primary object of the invention is to devise a way of bonding ridge structure laser diode chips upon substrates expitaxial layers face-down in a manner that is satisfactory for the bonding of laser chips possessing DFB-type feedback structures.

Investigation of the degradation problem encountered when attempting to employ the bonding method that has proved acceptable for the bonding of ridge structure laser diode chips of the FP feedback type, to the bonding of those of the DFB feedback type, has indicated that the problem is associated with stress that is applied to the ridge during the bonding process. It appears that the ridge of a DFB laser is significantly more susceptible to the effects of applied stress than its FP laser counterpart. The application of stress to a semiconductor changes its refractive index. Such a change in index will change the effective optical pitch of a Bragg grating. The effect of such detuning is liable to be particularly deleterious if the stress detuning varies with distance along the length of the ridge because different sections will then be detuned to different extents. Accordingly the solution to the problem has involved a bonding regime in which this stress is either eliminated or significantly reduced. Such elimination or significant reduction of stress is useful not only in the bonding of ridge structure laser of the DFB feedback type, but also for their counterparts employing DBR or FP type optical feedback.

Stressing of the ridge of a ridge-structure laser diode chip by the solder by which that laser is solder-bonded epitaxial layers face-down upon a substrate is either eliminated or at least minimised by adopting a configuration that ensures that a free space is left between the surface of the substrate and the top of the ridge, or of any solder that may cover all or part of that ridge. Electrical contact between the top of the ridge and electrical contact material of the substrate is provided by an electrical path that includes an electrode layer that extends from the top of the ridge along the sides and bases of the two troughs, and then on out to where the chip is solder-bonded to the substrate.

The absence of a direct metallic contact between the top of the ridge of the chip and the directly opposite region of the substrate to which that laser diode chip is bonded makes the heat-sinking less efficient than if there were such a direct metallic contact, but the additional thermal impedance occasioned by its absence is less than that occasioned by bonding the laser diode chip the other way up.

Other features and advantages of the invention will be readily apparent from the following description of a preferred embodiment of the invention, the drawings and the claims.

BRIEF DESCRIPTION OF THE DRAWINGS

FIG. 3 is a schematic plan view of a portion of the supporting substrates of FIGS. 1 and 2.

DETAILED DESCRIPTION OF PREFERRED EMBODIMENT

Figure 1:
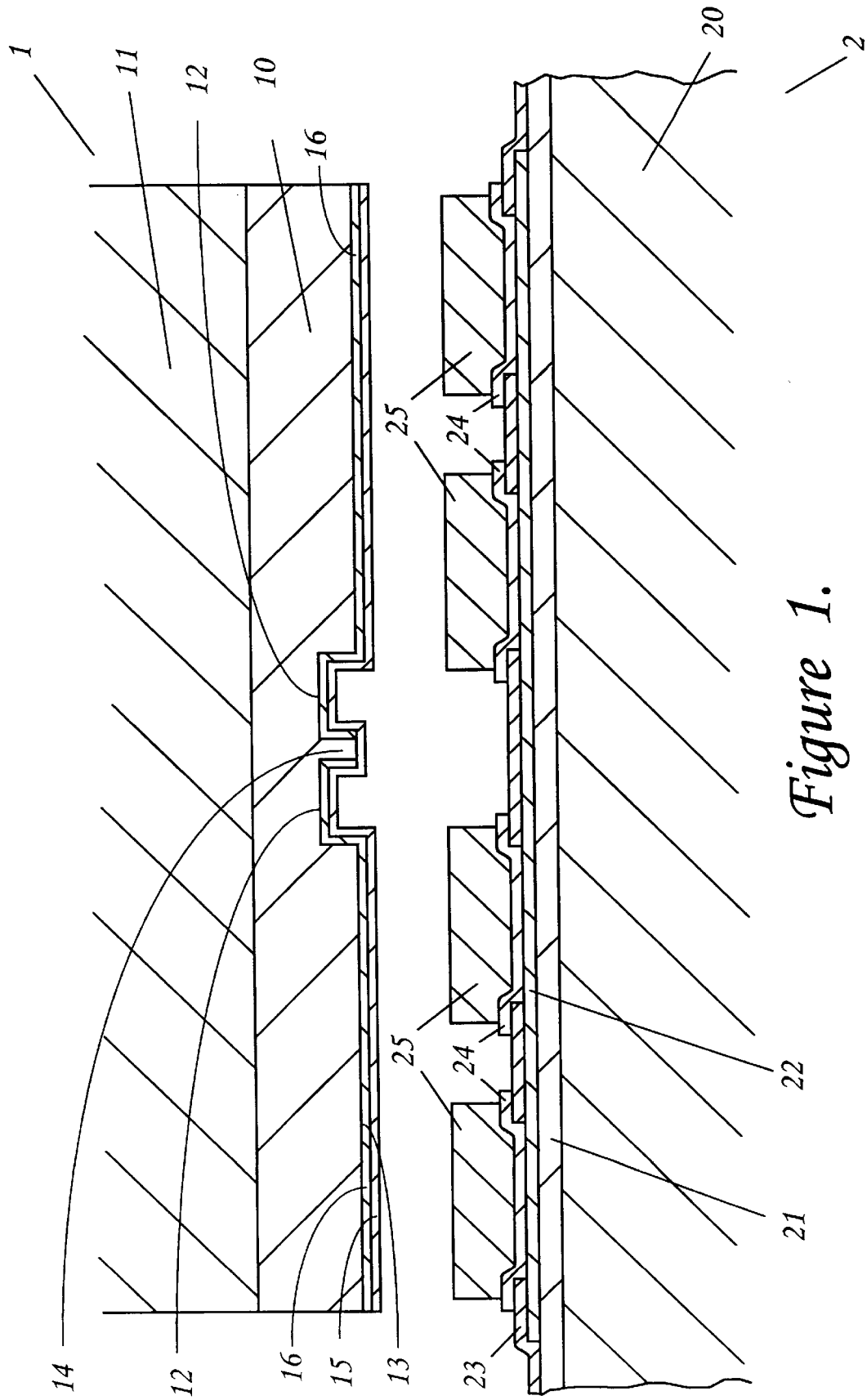
FIGS. 1 & 2 are schematic sectional views of portions of a ridge structure laser diode chip and its supporting substrate respectively before and after those portions have been bonded together with solder.

A ridge structure laser diode chip indicated generally at 1 has a layer structure (not shown) in semiconductor material 10 epitaxially deposited upon a single crystal substrate 11. The ridge structure of the laser chip is defined by the etching of two parallel shallow troughs 12 in the exposed face 13 of the epitaxial material 10 so as to define between them an intervening ridge 14 which may typically be found 2 $\mu$m wide and about 2 $\mu$m high. Electrical contact with the top of the ridge is provided by an electrode layer 15 whose exposed surface is made of solder-wettable material such as gold. The topmost layer of the epitaxially deposited semiconductor material 10 may be made of relatively highly doped material to which a ohmic type contact electrode layer 15 can readily be made by a triple layer sandwich of titanium, platinum, and gold. Electrical contact between this electrode layer 15 and the expitaxially deposited semiconductor material 10 is confined to the top of the ridge 14 by means of an electrically insulting layer 16, for instance of silica, beneath the electrode layer over the sides and base of each trough 12 and on out over the face 13 to the side edges of the chip 1.

The substrate to which this laser diode chip 1 is to be bonded is indicated generally at 2. The substrate 2 has a main body portion 20 which may be formed of a single crystal slice of silicon. The silicon is covered with an electrically insulating layer 21, for instance of silica and/or silicon nitride. Deposited on this layer 21 is an electrical interconnect layer 22, and this is covered with an electrically insulating layer 23 for instance of silica and/or silicon nitride. In order to ensure good adhesion with the electrically insulating layers 21 and 23, the electrical interconnect layer may be a triple layer sandwich of titanium, gold and platinum. A number of windows are opened, by etching, in the insulating layer 23 prior to the creation of electrical contact pads 24.

Figure 2:
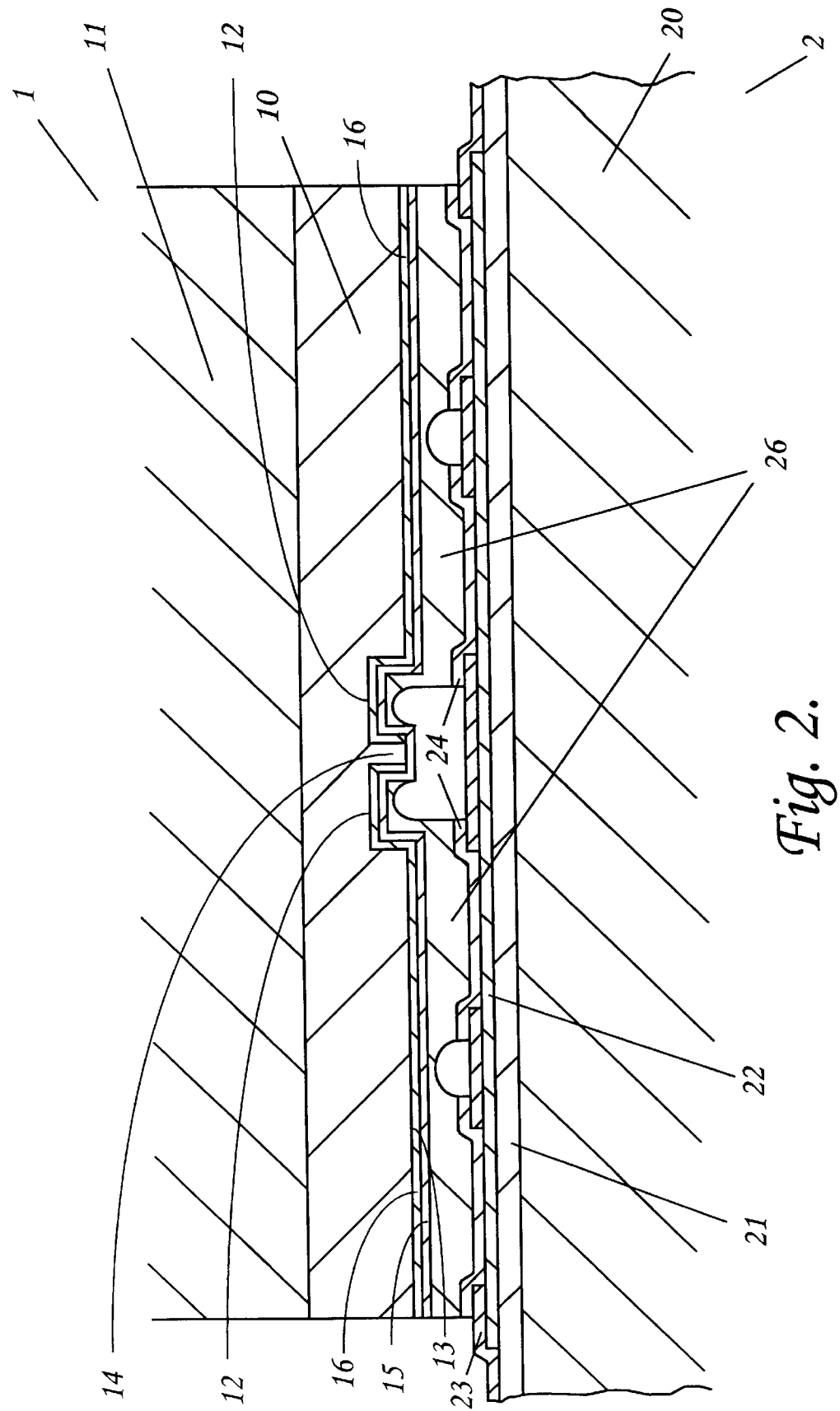

A window in the insulating layer 23 under each pad forms a via that allows that pad to make direct electrical contact with the underlying electrical interconnection layer 22. The pads 24, in the form of parallel stripes, are dimensioned and spaced so that they are just contained within an area equal to that of the chip 10, or extend only slightly beyond the confines of that area. Each pad is typically about 50 $\mu$m wide, and the distance between the middle two stripes is approximately matched with the aggregate width of the two troughs 12 and intervening ridge 14, this aggregate width typically being between 30 and 50 $\mu$m. The pads 24 need to adhere well to the underlying material of the electrically insulating layer 23, and also to that of the exposed regions of the electrical interconnect layer. A further requirement is that their exposed surfaces be solder-wettable. These requirements are conveniently satisfied by making them in the form of a triple-layer sandwich of titanium, platinum, and gold. On the gold of each pad 24 is deposited a solder preform 25 of substantially eutectic gold-tin solder. These solder preforms 25 may be initially formed to have an area slightly different, either larger or smaller than that of the pads 24 upon which they are deposited (smaller is illustrated in FIG. 1). When the deposited solder is first flowed, the solder-wettable nature of the pads 24, coupled with the non-wettable nature of the layer 23, ensures that, adjacent the substrate, the solder perimeter expands or contracts as appropriate to conform to the area of the underlying pad 24. This contrasts with the situation where the molten solder is in contact with the electrode layer 15 on the laser diode chip 10, for here the entire surface is solder-wettable, and so the solder is not specifically prevented from flowing in such a way as to bridge the gap between the preforms. The pattern of flow of the solder preforms 25 of FIG. 1 giving rise to the specifically depicted solder bond 26 of FIG. 2 is one in which the solder desired from the outer two preforms 25 has united with that desired from the inner two preforms, and in which there has additionally been some flow of solder into the two troughs 12 of the chip 1. It is to be clearly understood however that this is not the pattern of flow that necessarily occurs. What is necessary is that the solder does not flow to the extend of fully bridging the gap between the top of the ridge 14 of the chip 1 and the underlying top surface of the substrate 2, and preferably does not flow as far as to extend to an appreciable extent up the sides of the ridge 14. The requisite free space has been found readily ensured by use of solder preforms 25 of a thickness providing a solder bond 26 that spaces the pads 24 on the substrate 2 approximately 5 $\mu$m from the electrode layer 15 on the chip 1.

Electrical connection with the laser diode chip 1 is typically made by way of two wire bonds (neither shown), one direct to an electrode layer (not shown) on the exposed faced of the substrate material 11 of chip 1, and the other to a further exposed area (not shown) of the interconnect layer 22 of the substrate 2.

What is claimed is:

1. A ridge-structure laser diode chip bonded ridge face-down on to the surface of a substrate with a solder bond that leaves the ridge freely spaced from the substrate surface and provides an electrical connection with the ridge.

2. A laser diode chip as claimed in claim 1, wherein said surface of the substrate includes, facing the ridge, a region that is not solder-wettable, which region is flanked by electrically conductive regions which are solder-wettable and by which the solder bonds the chip to the substrate.

3. A laser diode chip as claimed in claim 2, wherein the solder is a substantially eutectic gold tin solder.

4. A method of bonding a ridge structure laser diode chip with solder to a substrate, which chip has a face in which is formed a parallel pair of troughs defining between them a ridge that constitutes the ridge of the ridge structure laser diode, chip, wherein said face of the chip is provided with a solder-wettable electrode layer by which electrical contact is made with the ridge, and wherein said face of the chip is solder-bonded with a face of the substrate in a region where an area of the substrate face that is not solder-wettable registers with the laser chip troughs and intervening ridge, which are flanked by solder-wettable areas that register with the face of the chip outboard of the troughs and intervening ridge, whereby no direct bond is established between the ridge of the laser diode chip and the region of the substrate facing that ridge.

* * * * *